(12) United States Patent
Xiong et al.

(10) Patent No.: US 11,796,597 B2
(45) Date of Patent: Oct. 24, 2023

(54) METHOD FOR ESTIMATING STATE OF CHARGE (SOC) OF LITHIUM-ION BATTERY SYSTEM BASED ON ARTIFICIAL INTELLIGENCE (AI)

(71) Applicant: BEIJING INSTITUTE OF TECHNOLOGY, Beijing (CN)

(72) Inventors: Rui Xiong, Beijing (CN); Jinpeng Tian, Beijing (CN); Yanzhou Duan, Beijing (CN)

(73) Assignee: BEIJING INSTITUTE OF TECHNOLOGY, Beijing (CN)

( * ) Notice: Subject to any disclaimer, the term of this patent is extended or adjusted under 35 U.S.C. 154(b) by 0 days.

(21) Appl. No.: 17/916,048

(22) PCT Filed: Sep. 1, 2021

(86) PCT No.: PCT/CN2021/116032
§ 371 (c)(1),
(2) Date: Sep. 30, 2022

(87) PCT Pub. No.: WO2022/100229
PCT Pub. Date: May 19, 2022

(65) Prior Publication Data
US 2023/0204668 A1 Jun. 29, 2023

(30) Foreign Application Priority Data
Nov. 16, 2020 (CN) .......................... 202011280497.9

(51) Int. Cl.
*G01R 31/367* (2019.01)
*G01R 31/378* (2019.01)
(52) U.S. Cl.
CPC ......... *G01R 31/367* (2019.01); *G01R 31/378* (2019.01)

(58) Field of Classification Search
CPC ........................... G01R 31/367; G01R 31/378
See application file for complete search history.

(56) References Cited

U.S. PATENT DOCUMENTS

2005/0194936 A1* 9/2005 Cho ...................... B60L 58/12
320/132

FOREIGN PATENT DOCUMENTS

CN 107769335 A 3/2018
CN 109031147 A 12/2018
(Continued)

OTHER PUBLICATIONS

C. Lyu, Y. Han, Q. Guo, L. Wang and Y. Song, "State-of-Charge Estimation of Lithium-ion Batteries Based on Deep Neural Network," 2020 Global Reliability and Prognostics and Health Management (PHM-Shanghai), Shanghai, China, 2020, pp. 1-7, doi: 10.1109/PHM-Shanghai49105.2020.9280940. (Year: 2020).*
(Continued)

*Primary Examiner* — Stacy Whitmore
(74) *Attorney, Agent, or Firm* — Bayramoglu Law Offices LLC

(57) ABSTRACT

A method for estimating the state of charge (SOC) of a lithium-ion battery system based on artificial intelligence (AI) is provided. In the method, the relationship between the charging data segments and the SOC of the battery system is established through deep learning, and the SOC at any stage of the charging process can be corrected. SOC in a discharging process is estimated through ampere-hour integration. The estimation method is adaptively updated with a change in the working state of the battery system.

5 Claims, 2 Drawing Sheets

(56) References Cited

FOREIGN PATENT DOCUMENTS

| CN | 109633470 A | 4/2019 |
| CN | 110058175 A | 7/2019 |
| CN | 110673039 A | 1/2020 |
| CN | 112379272 A | 2/2021 |

OTHER PUBLICATIONS

Li Chaoran, et al., Joint Estimation of the State of Charge and the State of Health based on Deep Learning for Lithium-ion Batteries, Proceedings of the CSEE, 2020.

Yuejiu Zheng, et al., Investigating the error sources of the online state of charge estimation methods for lithium-ion batteries in electric vehicles, Journal of Power Sources, 2018, pp. 161-188, vol. 377.

\* cited by examiner

METHOD FOR ESTIMATING STATE OF CHARGE (SOC) OF LITHIUM-ION BATTERY SYSTEM BASED ON ARTIFICIAL INTELLIGENCE (AI)

CROSS REFERENCE TO THE RELATED APPLICATIONS

This application is the national phase entry of International Application No. PCT/CN2021/116032, filed on Sep. 1, 2021, which is based upon and claims priority to Chinese Patent Application No. 202011280497.9, filed on Nov. 16, 2020, the entire contents of which are incorporated herein by reference.

TECHNICAL FIELD

The present disclosure relates to the field of battery systems and, in particular, to the state of charge (SOC) estimation for a lithium-ion battery system.

BACKGROUND

During the operation of a lithium-ion battery, a battery management system can obtain only signals, such as voltage, current, and temperature, and SOC cannot be directly measured but needs to be estimated based on sampled signals. At present, a battery SOC estimation method mainly uses a battery model combined with ampere-hour integration to estimate SOC during discharging. Such a method relies on the relationship between SOC and voltage modeling, implements closed-loop correction through ampere-hour integration, and has some limitations in implementation. First, the voltages of some battery systems, such as lithium iron phosphate or lithium titanate batteries, are insensitive to SOC changes. Therefore, an SOC estimation effect is poor. In addition, the voltage simulation accuracy of a battery voltage model decreases at a low temperature, high current, and low SOC. Further, the dynamic discharging process of the battery is variable. For example, the discharging condition of a vehicle's battery power depends on factors, such as the habit of a driver, the region, the season, and the weather. In these different situations, it is difficult to ensure the robustness in the large-scale application of an algorithm developed based on only a few of offline experiments. Therefore, there is a lack of a method for estimating the SOC of a lithium-ion battery system with good adaptability for complex and variable actual usage conditions, a simple execution process, and high robustness in the art.

SUMMARY

Given this, the present disclosure provides a method for estimating the SOC of a lithium-ion battery system based on artificial intelligence (AI), including the following steps:
Step 1: A daily charging curve of a battery system in various charging manners is obtained as training data.
Step 2: The charging curve is divided into data segments, and SOCs are calibrated at the last points of the data segments.
step 3: An applicable deep learning algorithm is selected. The algorithm is trained by using the data segments obtained in step 2. A mapping relationship is established between the data segments and the SOCs at the last points of the data segments.
Step 4: A trained deep learning algorithm obtained in step 3 is practically applied. The charging data segment acquired by a battery management system is inputted into the deep learning algorithm, and an estimated battery SOC is outputted.
step 5: The SOC is recursively calculated by using an ampere-hour integration algorithm between every two charging processes.

Further, after the lithium-ion battery system is fully charged and fully discharged, the deep learning algorithm is retrained and updated by using a charging curve acquired by the battery management system.

Further, in step 1, common charging methods including constant current charging, constant current and constant voltage charging, multi-stage constant current charging, and pulse charging may be used when the daily charging curve is obtained. The obtained curve includes parameters, such as battery charging current, voltage, and temperature parameters. The battery capacity is obtained through ampere-hour integration, and SOC at each moment on the charging curve is calculated.

Further, dividing the charging curve into data segments in step 2 specifically includes: determining a preset segment length and sliding the preset segment length on the charging curve to divide the charging curve obtained in step 1 into a plurality of data segments with the preset segment length, where the data segments each include a sampled signal sequence, such as a voltage, a current, or a temperature, at each moment. In addition, the SOCs at the last points of the data segments are determined.

Further, the deep learning algorithm in step 3 is a convolutional neural network, a densely connected network, a recurrent neural network, or the like. The deep learning algorithm is trained by using a preferred gradient descent algorithm and various variants of the gradient descent algorithm. The data segments are used as input of the deep learning algorithm, and the SOCs at the last points of the segments are used as the output of the algorithm.

Further, in step 5, a change in the SOC between the two charging processes is obtained by using the ampere-hour integration algorithm to recursively calculate the SOC.

The method provided in the present disclosure makes full use of the controllable charging process. The relationship between the charging signal segments and the SOC is trained by using the deep learning algorithm. In each charging process, the signal segment is acquired to calibrate the battery SOC, and the SOC between the two charging processes is estimated through ampere-hour integration. This avoids the impact of a poor modeling effect and high uncertainty on battery SOC estimation in the discharging process. In addition, the deep learning algorithm is retrained by using the re-acquired charging curve data after full charging and full discharging such that the method in the present disclosure features self-adaptation and can rapidly update the SOC estimation algorithm through transfer learning when working conditions of the battery change.

DETAILED DESCRIPTION OF THE EMBODIMENTS

The foregoing is merely an overview of the technical solutions of the present disclosure. To explain the technical means of the present disclosure more clearly, the present disclosure will be further described in detail below with reference to the accompanying drawings and specific embodiments.

Figure 1:
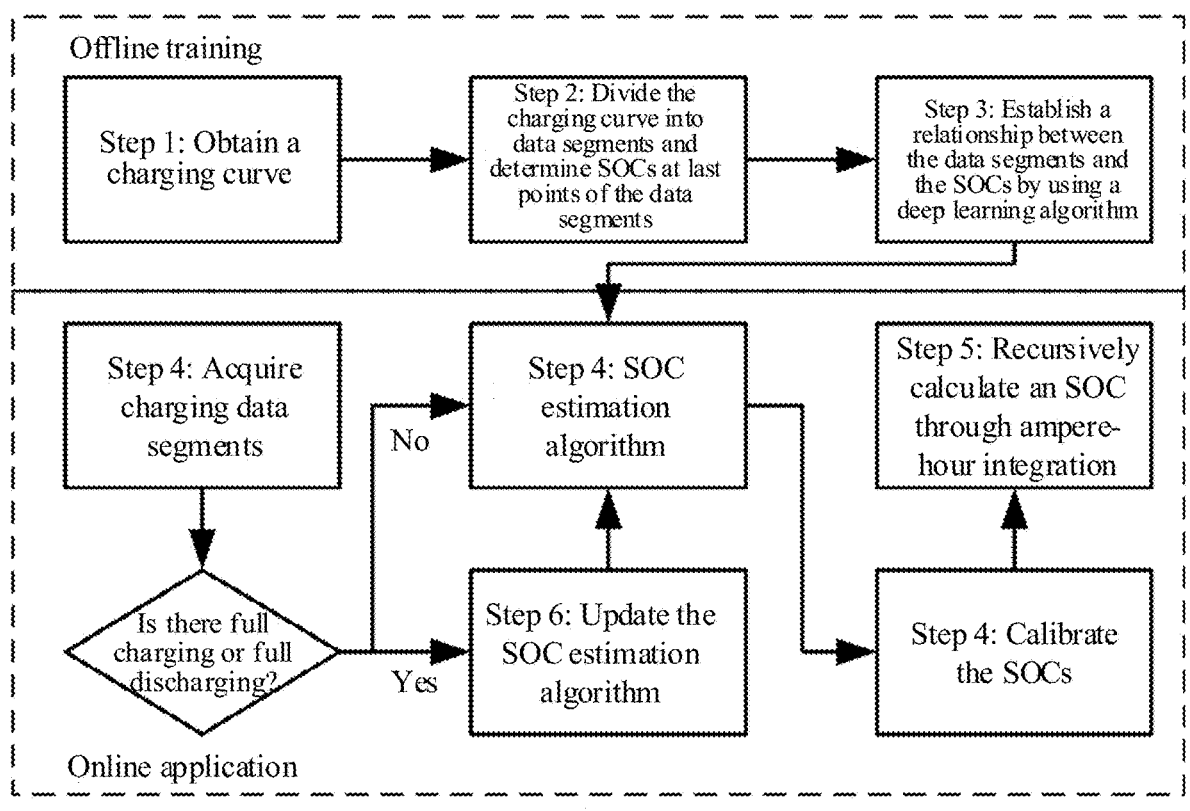
FIG. 1 is a flowchart of a method according to the present disclosure.

As shown in FIG. 1, a method for estimating the SOC of a lithium-ion battery system based on AI provided in the present disclosure includes the following steps:

Step 1: A battery is charged using common charging methods, such as constant current charging, constant current and constant voltage charging, multi-stage constant current charging, and pulse charging. A battery management system obtains the daily charging curve of a battery system as training data through battery testing. The capacity of the battery is obtained through ampere-hour integration, and SOC is calculated at each moment of the charging curve.

Step 2: The charging curve is divided into data segments, and SOCs are calibrated at the last points of the data segments. A preset segment length is determined and the preset segment length is slid on the charging curve to divide the charging curve obtained in step 1 into the data segments with the length. The segments each include a sampled signal sequence, such as a voltage, a current, or a temperature, at each moment. SOCs are determined at the last points of the segments.

Step 3: A mapping relationship is established between the data segments and the SOCs at the last points of the segments by using a deep learning algorithm, such as a convolutional neural network, a densely connected network, or a recurrent neural network. The input of the deep learning algorithm is the data segments in step 2, and the output is the SOCs at the last points of the segments. The learning algorithm is trained by using a gradient descent algorithm and various variants of the gradient descent algorithm.

Figure 2:
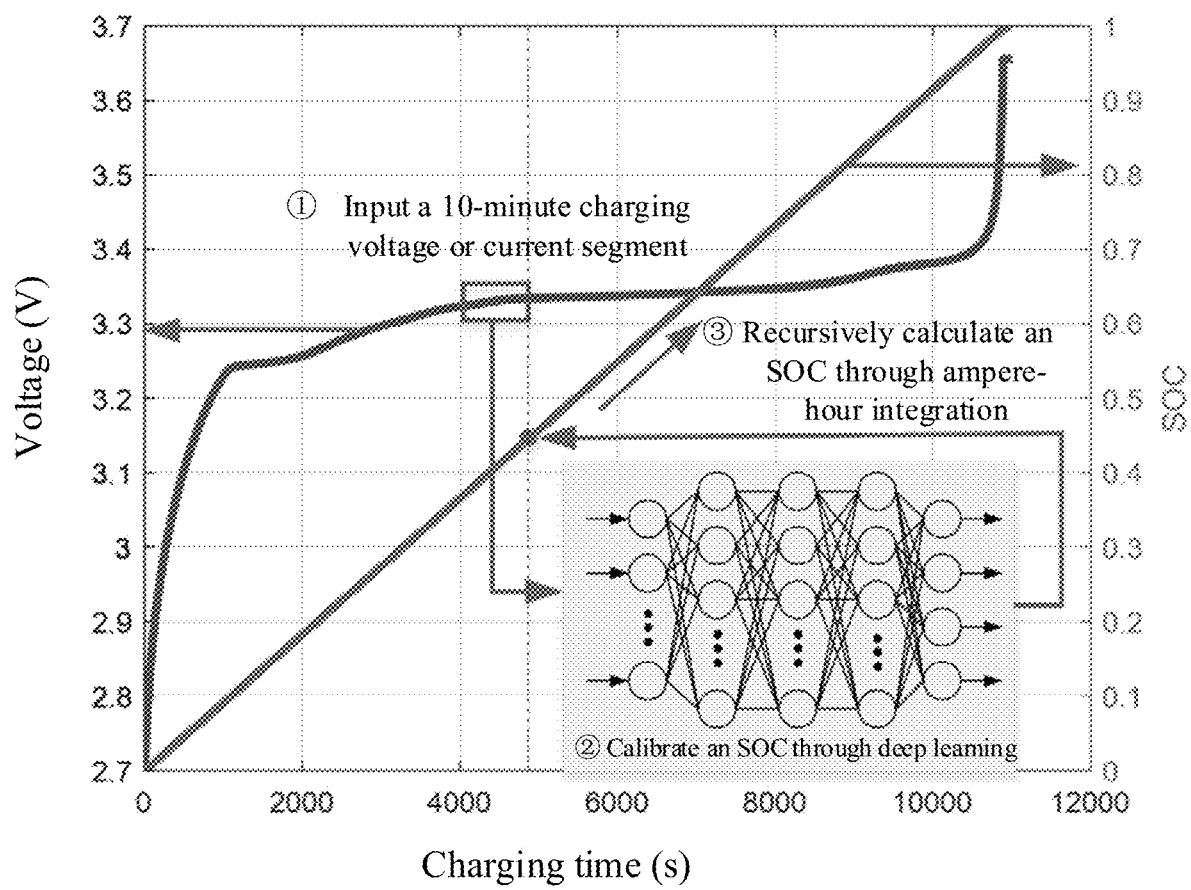
FIG. 2 is a schematic diagram of a process of estimating the SOC of a lithium iron phosphate battery according to the present disclosure.

Step 4: In the actual application of the battery system, a charging data segment is acquired as input of the deep learning algorithm, and the SOC of the battery is output. When the battery is actually running, the battery management system acquires the charging data segment based on the settings in step 2 during charging, inputs the acquired charging data segment to the deep learning algorithm trained in step 3, and outputs the SOC at the last point of the segment. In a preferred embodiment of the present disclosure, as shown in processes ① and ② in FIG. 2, for 0.3 C constant current and constant voltage charging of a lithium iron phosphate battery, a charging curve is divided into voltage or current data segments with a length of up to 10 minutes. A deep recurrent neural network is trained with the segments as input and SOCs at the last points of the segments as output. After the training, a 10-minute voltage or current data segment acquired by the battery management system can be used to estimate the SOC at the last point of the 10-minute segment. In addition, the algorithm can process a data segment with an arbitrary length by marking part of the data segment as missing (for example, set to 0) during the training. For example, when the length of the acquired data segment is less than 10 minutes, the data segment can be filled with missing markers (for example, 0) to obtain a 10-minute data segment, which is input to the algorithm to estimate the SOC.

Figure 3:
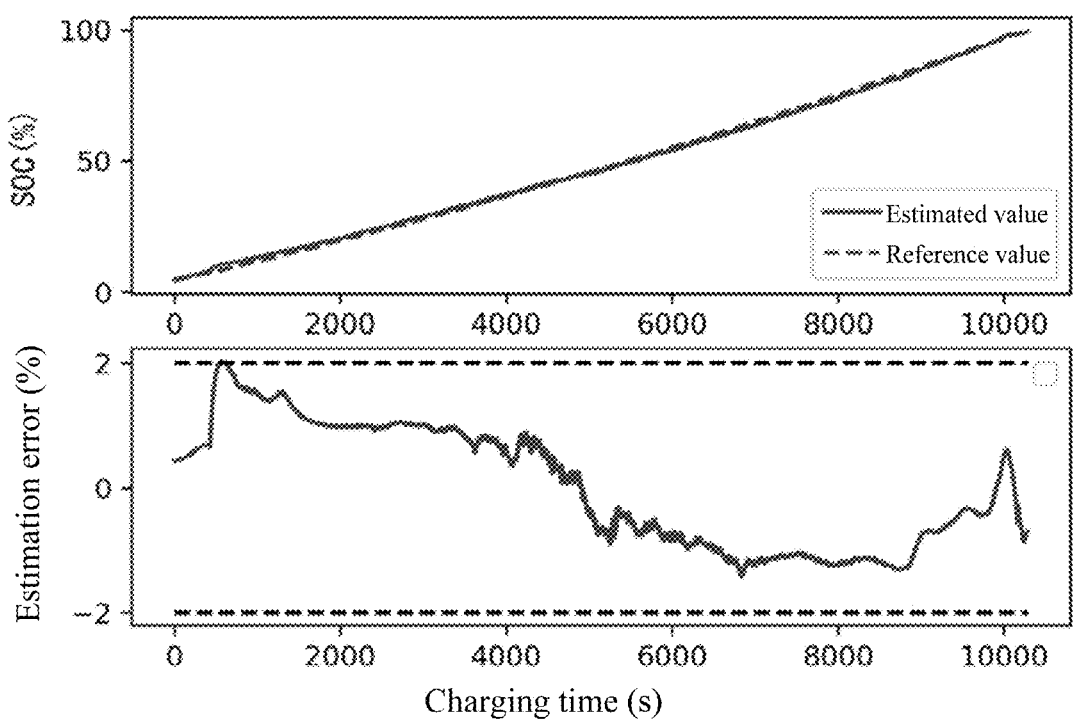
FIG. 3 is a diagram of a result of estimating the SOC of a lithium iron phosphate battery according to the present disclosure.

Step 5: Between two charging processes, the SOC is recursively calculated by using an ampere-hour integration algorithm. With the SOC at the last point of the segment estimated in step 4 as an initial value, the SOC is recursively calculated through ampere-hour integration, as shown in a process ③ in FIG. 2. During the ampere-hour integration, charging and discharging amounts of the battery are calculated to obtain a change in the SOC such that the SOC between the two charging processes is recursively calculated. The system returns to step 4 to update the SOC of the battery until an available charging data segment is acquired in the next battery charging process. The SOC estimation result and SOC estimation error of the lithium iron phosphate battery during the charging in this embodiment are shown in FIG. 3.

Step 6: After the battery system undergoes operations, such as full charging and full discharging, a corresponding charging curve is acquired and the algorithm used to estimate the SOC of the battery is updated. After the battery system is charged to an upper cutoff voltage (at this time, SOC=100%) and discharged to a lower cutoff voltage (at this time, SOC=0) during use, the charging curve containing one of the foregoing two processes is acquired. The charging curve is divided into charging data segments consistent with those in step 2, and SOCs at the last points of the data segments are calculated as new training data used to update the deep learning algorithm. The SOC estimation algorithm can be updated by fine-tuning some parameters of the pre-trained deep learning algorithm.

Although the embodiments of the present disclosure have been illustrated and described, it should be understood that those of ordinary skill in the art may make various changes, modifications, replacements, and variations to these embodiments without departing from the principle and spirit of the present disclosure, and the scope of the present disclosure is limited by the appended claims and their legal equivalents.

What is claimed is:

1. A method for estimating a state of charge (SOC) of a lithium-ion battery system based on artificial intelligence (AI) comprising the following steps:

step 1: obtaining a daily charging curve of a battery system as training data;

step 2: dividing the daily charging curve into data segments and calibrating SOCs at last points of the data segments comprises: determining a preset segment length and sliding the preset segment length on the daily charging curve to divide the daily charging curve obtained in step 1 into a plurality of data segments with the preset segment length, wherein the data segments each comprise a sampled signal sequence from a corresponding portion of the daily charging curve; and determining the SOCs at the last points of the data segments;

step 3: selecting a deep learning algorithm, training the deep learning algorithm by using the data segments obtained in step 2, and establishing a mapping relationship between the data segments and the SOCs at the last points of the data segments with the data segments obtained in step 2 as input of the deep learning algorithm and the SOCs at the last points of the data segments as output of the deep learning algorithm;

step 4: practically applying a trained deep learning algorithm obtained in step 3, inputting a charging data segment acquired by a battery management system into the deep learning algorithm, and outputting an estimated battery SOC; and step 5: recursively calculating the SOC by using an ampere-hour integration algorithm between every two charging processes.

2. The method according to claim 1, wherein after a lithium-ion battery is fully charged and fully discharged, the deep learning algorithm is retrained and updated by using a charging curve acquired by the battery management system.

3. The method according to claim 1, wherein in step 1, constant current charging, constant current and constant voltage charging, multi-stage constant current charging, or pulse charging is used when the daily charging curve is obtained; the daily charging curve comprises battery charging current, voltage, and temperature parameters; and a battery capacity is obtained through ampere-hour integration, and an SOC at each moment on the daily charging curve is calculated.

4. The method according to claim 1, wherein the deep learning algorithm in step 3 is a convolutional neural network, a densely connected network, or a recurrent neural network, and the deep learning algorithm is trained by using a gradient descent algorithm.

5. The method according to claim 1, wherein in step 5, a change in the SOC between the two charging processes is obtained by using the ampere-hour integration algorithm to recursively calculate the SOC.

* * * * *